(12) United States Patent
Kroneberger et al.

(10) Patent No.: US 9,281,231 B2
(45) Date of Patent: Mar. 8, 2016

(54) NON-CONTACT MAGNETIC DRIVE ASSEMBLY WITH MECHANICAL STOP ELEMENTS

(71) Applicant: Ferrotec (USA) Corporation, Santa Clara, CA (US)

(72) Inventors: Cris Kroneberger, Livermore, CA (US); Bharatkumar Patel, Fremont, CA (US)

(73) Assignee: Ferrotec (USA) Corporation, Santa Clara, CA (US)

(\*) Notice: Subject to any disclaimer, the term of this patent is extended or adjusted under 35 U.S.C. 154(b) by 753 days.

(21) Appl. No.: 13/649,703

(22) Filed: Oct. 11, 2012

(65) Prior Publication Data

US 2013/0095973 A1    Apr. 18, 2013

Related U.S. Application Data

(60) Provisional application No. 61/546,433, filed on Oct. 12, 2011.

(51) Int. Cl.

| | |
|---|---|
| *F16H 1/28* | (2006.01) |
| *H01L 21/687* | (2006.01) |
| *C23C 14/50* | (2006.01) |
| *H01L 21/67* | (2006.01) |
| *F16H 57/08* | (2006.01) |

(52) U.S. Cl.
CPC ........ *H01L 21/68792* (2013.01); *C23C 14/505* (2013.01); *H01L 21/6719* (2013.01); *H01L 21/68764* (2013.01); *H01L 21/68771* (2013.01); *H01L 21/68785* (2013.01); *F16H 1/28* (2013.01); *F16H 57/08* (2013.01); *Y10T 29/49826* (2015.01)

(58) Field of Classification Search
CPC .................. H01L 21/68771; H01L 21/68764; H01L 21/68785; C23C 14/505; G01C 19/06; G01C 19/24; G01C 16/26; F03G 3/02; F03G 3/308; F16H 1/28; F16H 57/08
USPC ........ 74/5.1, 5.37, 5.46, 84 R, 84 S, 665 GA, 74/665 H; 475/11, 149, 331, 293; 118/730
See application file for complete search history.

(56) References Cited

U.S. PATENT DOCUMENTS

| | | | |
|---|---|---|---|
| 5,479,058 A | \* | 12/1995 | Seidou ................... H02K 7/116 310/261.1 |
| 5,795,448 A | | 8/1998 | Hurwitt et al. |

(Continued)

OTHER PUBLICATIONS

PCT international search report and written opinion for co-pending PCT/US2012/059888.

*Primary Examiner* — Roger Pang
(74) *Attorney, Agent, or Firm* — Robert R. Deleault, Esq.; Mesmer & Deleault, PLLC

(57) ABSTRACT

A non-contact magnetic drive assembly with mechanical stop elements for a vacuum deposition system employing a lift-off process having a HULA configuration featuring a plurality of magnets coupled in an annular orientation to a central ring and an orbital ring, each magnet of the orbital ring becomes superposed with a magnet of the central ring as the orbital ring rotates, and a central drive component driving either the central ring, the orbital ring around the central ring or both simultaneously, the central drive component provides a rotational speed allowing non-contact, magnetic drive rotation of the orbital ring around the central ring until a difference between a magnetic drive torque of the superposed magnets and the rotational speed of the central drive component causes the superposed magnets to decouple enabling mechanical drive rotation by interactive contact between a plurality of central ring teeth and a plurality of orbital ring.

21 Claims, 10 Drawing Sheets

(56) References Cited

U.S. PATENT DOCUMENTS

| | | |
|---|---|---|
| 5,902,185 A | 5/1999 | Kubiak et al. |
| 6,183,615 B1 | 2/2001 | Yasar et al. |
| 6,454,908 B1 | 9/2002 | Schertler et al. |
| 8,084,912 B2 * | 12/2011 | Mizushima ............ H02K 7/116 310/179 |
| 2003/0085114 A1 | 5/2003 | Johnson et al. |
| 2010/0272893 A1 | 10/2010 | Chang et al. |

* cited by examiner

NON-CONTACT MAGNETIC DRIVE ASSEMBLY WITH MECHANICAL STOP ELEMENTS

BACKGROUND OF THE INVENTION

1. Field of the Invention

The present invention relates to a vacuum treatment system for vacuum coating/deposition. Particularly, the present invention relates to a drive mechanism for a vacuum coating/deposition systems.

2. Description of the Prior Art

Electron beam evaporation is one method of physical vapor deposition for integrated circuit lift-off processes and optical coatings. Electron beam evaporation may be used to deposit a thin metal layer on a semiconductor wafer or other substrate. The deposited metal layer may be subsequently etched to create circuit traces of integrated circuits.

Various systems have been developed using physical vapor deposition techniques. Some systems are linear systems where the target product (the substrate) is affixed to a carrier that is linearly brought into a vacuum chamber along a set of rails where the deposition apparatus, i.e. the electron gun, is located. Once the desired deposition has occurred, the target product is then moved linearly along to an exit port or returned to the entrance port for removal from the vacuum deposition system. These systems employ mechanical drive systems such as drive belts or gears or drive tapes to move the carrier containing the substrate through the vapor deposition system.

There have also been developed systems that provide greater throughput of the substrate while achieving more highly-uniform deposits of metal layers on the substrate(s). To improve uniformity, manufacturers have developed an evaporation system having multiple substrate support trays that rotate about their axes while also moving in a circle around the outside of a central drive ring. One such system, known as a high uniformity lift-off assembly (HULA), features a central drive ring with teeth/gears around its perimeter. The system also has smaller rotating substrate holders/carriers positioned around the perimeter of the central ring. As the outer rings move around the perimeter of the central ring, teeth on the perimeters of the outer rings engage the teeth on the central ring, causing the outside rings to also rotate about their central axes. In some systems, the drive ring may have gears located near the hub that are linked to gears or teeth on secondary rings. Using teeth, gears, or other features located on a primary ring and on secondary rings is an example of a positive drive mechanism.

An alternative to the above-disclosed mechanical drive systems, there has been developed drive systems that incorporate the use of a magnetic drive/transfer system. This magnetic transfer system is provided with a rotational driving member which is divided into two portions serving as a fixed driving shaft and a movable driving shaft in the axial direction and in which the fixed driving shaft is secured to a shaft core member so as to be limited in the rotational direction but so as to be freely movable in the axial direction at a certain width. Spiral magnetic coupling sections are formed on the surface of each driving shaft at the same pitch. The carrier can be freely moved against the surface of the rotational driving member in its axial direction and is provided with magnetic coupling sections at an interval equal to a pitch in the spiral magnetic coupling sections. By rotating the rotational driving member, the carrier linearly moves.

One example of a rotational system is disclosed in U.S. Pat. No. 6,454,908 (Shertler et al., 2002). Shertler et al. disclose a vacuum chamber in which there is at least one part that is driven in rotation and is connected by a gear train. The gear train has at least two rotating transmission bodies with a motor drive unit. The rotating transmission bodies produce relative motion in a rolling manner. The rotating transmission bodies are magnetically drive-coupled to each other, and at least one of them is located in the vacuum chamber.

SUMMARY OF THE INVENTION

Although prior art electron beam deposition systems have seen various improvements in product output, one drawback of a positive drive system in HULA systems is that physical contact between the teeth results in wear and introduces fine particles into the evaporation chamber. Typically, the gears are made of metal and fine metal particles may be released into the evaporation chamber. If and when released, these fine metal particles contaminate or otherwise interfere with the quality of the deposited metallic layer and resulting integrated circuits.

To avoid the problem of impurities caused by contact between moving parts in the evaporation chamber, a non-contact magnetic drive system has been developed. Instead of physical contact between gears or teeth, a magnetic drive system uses the attractive or repulsive force between pairs of magnets to cause the outer substrate holder rings (i.e. the orbital rings) to rotate. Each secondary ring has magnets equally spaced around its perimeter that correspond to magnets positioned around the perimeter of a primary drive ring. As the primary ring rotates, the edges of the primary and secondary rings remain in close proximity with each other, but they do not touch. One ring may be positioned so that its perimeter passes just above or below the perimeter of another ring with which it magnetically interacts. Alternately, the two rings may be positioned with their perimeters closely adjacent each other. As the central or primary ring rotates, magnets located around the perimeter of the central ring drive secondary/orbital rings using magnetic forces between the corresponding magnets on the central and orbital rings. In the alternative, the central ring may be stationary and the orbital rings rotate around the central ring using the same magnetic forces to accomplish the rotation action.

A disadvantage of non-contact, magnetic drive systems is the limited amount of torque available to drive the system. This limited available torque requires gentle and/or strictly controlled acceleration and deceleration profiles for the drive system to work properly. Unfortunately, there are situations where high-torque conditions exist. Examples of high-torque conditions include when rapid acceleration of the HULA system is required or when a bearing sticks causing deceleration. The driving torque required to accelerate or rotate the rings may exceed the coupling force between the magnets. This causes the magnets of the rotating ring to magnetically decouple from the magnets of the stationary ring. The decoupled rotating ring will then freewheel, spin at an inconsistent speed, and will most likely slow down and not recouple.

Therefore, what is needed is a drive system that combines the advantages of both a non-contact magnetic drive system and a positive/mechanical drive system while minimizing the disadvantages of each system, i.e. a positive/mechanical drive system and a non-contact, magnetic drive system. The present invention provides improvements to the drive assemblies of deposition systems by combining the non-contact benefits of a magnetic drive system with the higher torque and positive drive capability of a mechanical drive system while preventing decoupling of the magnets in the non-contact magnetic drive system.

It is an object of the invention to object of the invention to combine the non-contact benefits of a magnetic drive system with the higher torque and positive drive capability of a mechanical drive system.

It is another object of the invention to provide a deposition drive system having a positive drive arrangement that may be temporarily engaged to provide higher torque when required.

It is another object of the invention to provide a deposition drive system that results in fewer particulates generated from contact between moving parts.

It is another object of the invention to provide a sensor system to indicate when the magnetic coupling force has been exceeded and to sense engagement of the positive drive system.

The present invention achieves these and other objectives by providing a vacuum deposition system incorporating a non-contact magnetic drive system with mechanical stop elements for a vacuum deposition system employing a lift-off process having a HULA configuration. In one embodiment of the present invention, a HULA drive assembly includes a central ring having a plurality of equally-spaced central ring teeth disposed around the central ring a predefined radial distance from a center of the central ring defining a central teeth spacing, an orbital ring rotatable about an orbital ring central axis, the orbital ring having a plurality of equally-spaced, orbital ring teeth disposed around the orbital ring a predefined radial distance from a center of the orbital ring defining an orbital teeth spacing where the orbital ring teeth are positioned to coincide with the central teeth spacing of the central ring, and a central drive component adapted to drive one of the central ring, the orbital ring around the central ring or both simultaneously.

The central ring includes a plurality of equally-spaced, central ring magnets where each one of the plurality of magnets is coupled to the central ring a predefined radial distance from a center of the central ring along one of a radial axis of the central ring teeth or a radial axis of the central teeth spacing. The orbital ring includes a plurality of equally-spaced, orbital ring magnets where each one of the plurality of orbital ring magnets is disposed on the orbital ring a predefined radial distance from a center of the orbital ring along (1) a radial axis of the orbital ring teeth when each of the corresponding plurality of magnets of the central ring is disposed along the radial axis of the central teeth spacing or (2) a radial axis of the orbital ring spacing when each of the corresponding plurality of magnets of the central ring is disposed along the radial axis of the central ring teeth.

Each of the plurality of orbital ring magnets becomes superposed in turn with a corresponding magnet of the plurality of central ring magnets as the orbital ring rotates about the orbital ring central axis. The central teeth spacing and the orbital teeth spacing are larger than the width of each of the corresponding central ring teeth and orbital ring teeth so that the interleaving of the orbital ring teeth and the central ring teeth defines an orbital/central ring tooth spacing between adjacent orbital ring teeth and central ring teeth. The central drive component provides a rotational speed that allows non-contact, magnetic drive rotation of the orbital ring around the central ring until a difference between the magnetic drive torque provided by the superposed magnets and the rotational speed of the central drive component causes the superposed magnets to decouple enabling mechanical drive rotation by the interactive contact between the central ring teeth and the orbital ring teeth.

In another embodiment of the present invention, the plurality of central ring magnets is arranged in an alternating configuration of north-south poles.

In a further embodiment, a magnet bridge component directly connects two adjacent magnets of the central ring to cause bridging the magnetic force of each magnet to thereby increase the magnetic force.

In still another embodiment, each one of the plurality of central ring magnets is coupled to one of the central teeth spacing. Alternatively, each one of the plurality of central ring magnets is coupled to one of the central ring teeth.

In yet another embodiment of the present invention, the plurality of orbital ring magnets is arranged in an alternating configuration of north-south poles.

In another embodiment, a magnet bridge component directly connects two adjacent magnets of the orbital ring to cause bridging the magnetic force of each magnet to thereby increase the magnetic force.

In a further embodiment, each one of the plurality of orbital ring magnets is coupled to one of the orbital teeth spacing when each one of the plurality of central ring magnets is coupled to one of the central ring teeth. Alternatively, each one of the plurality of orbital ring magnets is coupled to one of the orbital ring teeth when each one of the plurality of central ring magnets is coupled to one of the central ring spacing.

In another embodiment of the present invention, there is included a magnetic drive indicator system adapted to differentiate when the non-contact magnetic drive rotation is enabled and when the mechanical drive rotation is enabled.

In a further embodiment, the magnetic drive indicator system includes a rotation sensor and a rotation sensing assembly. The rotation sensor is disposed along and coupled to the periphery of the plurality of central ring teeth. The rotation sensor assembly is disposed in a fixed location apart from the central ring. The rotation sensing assembly is adapted to align with the rotation sensor upon each revolution of the central ring. The orbital ring teeth are configured to provide non-interrupted alignment of a signal between the rotation sensor and the rotation sensing assembly when the non-contact magnetic drive rotation is enabled and to provide interrupted alignment of the signal when mechanical drive rotation is enabled.

In another embodiment of the present invention, the central drive component includes a central ring home sensor assembly connected to a drive shaft of the central drive component. In one embodiment, the central ring home sensor assembly includes a central ring home sensor and a rotatable central ring home sensor disk. The central ring home sensor disk is adapted to align a position indicator on the home sensor disk with the home sensor when the orbital ring is positioned at a location on the periphery of the central ring when the orbital ring is aligned with a loading and unloading access port of a vacuum deposition system.

In still another embodiment of the present invention, the central drive component includes a drive shaft home sensor assembly. The drive shaft home sensor assembly includes a drive shaft sensor and a rotatable drive shaft sensor disk coupled to the drive shaft. The rotatable drive shaft sensor disk is adapted to align a position indicator on the drive shaft sensor disk with the drive shaft sensor. This alignment corresponds with the alignment of the home sensor disk position indicator and the central ring home sensor.

In still another embodiment of the present invention, the central ring has a removable block containing a predefined portion of the plurality of central ring teeth. This embodiment is an alternative to the embodiments employing a central ring home sensor assembly and/or the drive shaft sensor assembly. The removable block allows a user to align an orbital ring with the removable block and to remove the removable block from the center ring, which then allows loading and unloading of the orbital ring(s).

In still another embodiment of the present invention, a method of increasing throughput in a lift-off process vacuum deposition system while minimizing particulate contamination and incomplete batching of silicon wafers is disclosed. The method includes obtaining a non-contact, magnetic drive HULA assembly with mechanical stop elements and installing the HULA assembly in a vacuum chamber of a lift-off process vacuum deposition system. The obtaining step includes selecting a non-contact, magnetic drive HULA assembly with mechanical stop elements where a plurality of magnets are coupled in an annular orientation to each of a central ring and an orbital ring that provides for each of the plurality of orbital ring magnets in turn becoming superposed with a corresponding magnet of the plurality of central ring magnets as the orbital ring rotates about an orbital ring central axis. It further includes selecting an assembly that includes a central drive component that is adapted to drive one of the central ring, the orbital ring around the central ring or both simultaneously. The selecting step also includes selecting a central drive component that provides a rotational speed allowing non-contact, magnetic drive rotation of the orbital ring around the central ring until a difference between a magnetic drive torque provided by the superposed magnets of the central ring and the orbital ring and the rotational speed of the central drive component causes the superposed magnets to decouple. Upon decoupling of the superposed magnets, the assembly then enables mechanical drive rotation by interactive contact between a plurality of central ring teeth and a plurality of orbital ring teeth.

In another embodiment of the method, the selecting step further includes selecting a magnetic drive HULA assembly that has a central ring and an orbital ring. The central ring has a plurality of equally-spaced central ring teeth disposed around the central ring a predefined radial distance from a center of the central ring defining a central teeth spacing. The central ring also has a plurality of equally-spaced, central ring magnets where each one of the plurality of magnets is coupled to the central ring a predefined radial distance from a center of the central ring along one of a radial axis of the central ring teeth or a radial axis of the central teeth spacing. The orbital ring is rotatable about an orbital ring central axis and has a plurality of equally-spaced, orbital ring teeth disposed around the orbital ring a predefined radial distance from a center of the orbital ring defining an orbital teeth spacing where the orbital ring teeth are positioned to coincide with the central teeth spacing. The orbital ring also has a plurality of equally-spaced, orbital ring magnets where each one of the plurality of orbital ring magnets is disposed on the orbital ring a predefined radial distance from a center of the orbital ring. The annular position of the plurality of orbital ring magnets is chosen from two alternative positions. The first is along a radial axis of the orbital ring teeth when each of the corresponding plurality of magnets of the central ring is disposed along the radial axis of the central teeth spacing. The second is along a radial axis of the orbital ring spacing when each of the corresponding plurality of magnets of the central ring is disposed along the radial axis of the central ring teeth. It is contemplated that each of the plurality of orbital ring magnets in turn becomes superposed with a corresponding magnet of the plurality of central ring magnets as the orbital ring rotates about the orbital ring central axis. It is also contemplated that the central teeth spacing and the orbital teeth spacing are larger than the width of each of the corresponding central ring teeth and orbital ring teeth. The interleaving of the orbital ring teeth and the central ring teeth defines an orbital/central ring tooth spacing between adjacent orbital ring teeth and central ring teeth.

In yet another embodiment of the present invention, the method includes selecting a magnetic drive HULA system where the plurality of central ring magnets is configured in an alternating orientation of north-south poles.

In another embodiment, the method includes selecting a magnetic drive HULA system where the plurality of orbital ring magnets is configured in an alternating orientation of north-south poles.

In a further embodiment. The method includes selecting a magnetic drive HULA system where two adjacent magnets of the central ring, of the orbital ring or both of the central ring and the orbital ring are bridged together to increase the magnetic force of the two adjacent magnets.

In another embodiment of the method, the method includes selecting a magnetic drive HULA system that has a magnetic drive indicator system that senses the interaction between the central ring and the orbital ring and that is adapted to differentiate when the non-contact magnetic drive rotation is enabled and when the mechanical drive rotation is enabled.

BRIEF DESCRIPTION OF THE DRAWINGS

FIG. 14 is a perspective view of view of a portion of the central drive component showing a central shaft, a clutch, a timing belt, and a feed-through.

DETAILED DESCRIPTION OF THE PREFERRED EMBODIMENT

Figure 1:
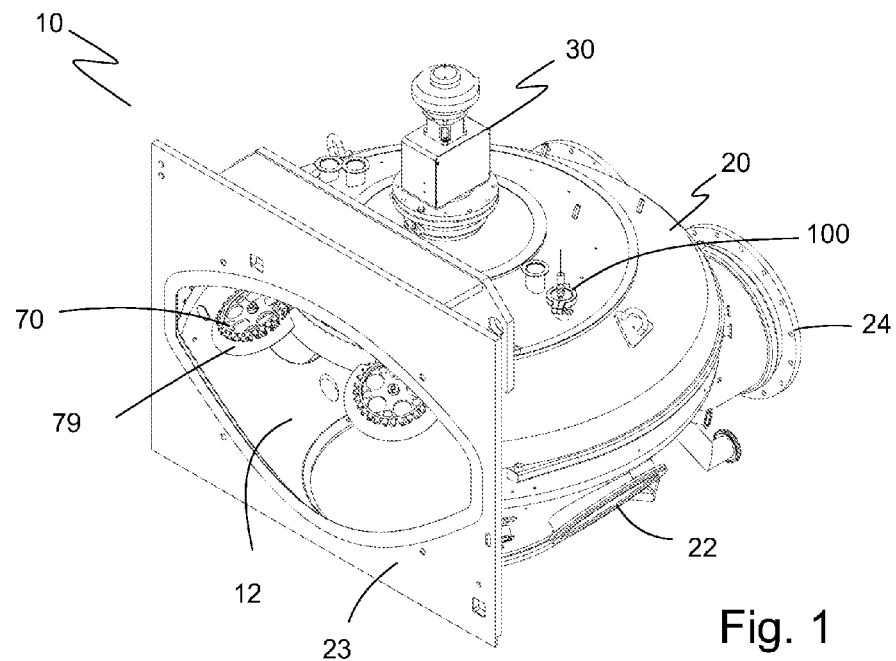
FIG. 1 is a perspective view of a deposition chamber employing a lift-off process in a HULA orientation containing a non-contact, magnetic drive assembly incorporating mechanical stop elements and an open front port.

The preferred embodiments of the present invention are illustrated in FIGS. 1-14. FIG. 1 shows a perspective view of deposition chamber 10 of the present invention. Deposition chamber 10 has a chamber volume 12 defined by a chamber housing 20 where chamber housing 20 has a plurality of ports 22 and 24 for access to and/or viewing of chamber volume 12 (i.e. the inside of chamber housing 20). Chamber housing 20 has a relatively large flanged housing opening 23 compared to ports 22, 24. Connected to chamber housing 20 and rotatably disposed within chamber volume 12 is a non-contact, magnetic drive assembly 30 that employs a lift-off process using a HULA orientation. HULA means a high uniformity lift-off assembly. As part of the HULA design, one or more orbital rings 70 are disposed within chamber volume 12 where each orbital ring 70 is adapted to support/hold a substrate holder 80 (not shown). The portion of the non-contact, magnetic drive assembly 30 disposed within chamber volume 12 is more clearly explained later. Also shown disposed through a top 21 of chamber housing 20 is a position sensing assembly 100, which is more clearly shown in FIG. 13 and described later.

Figure 2:
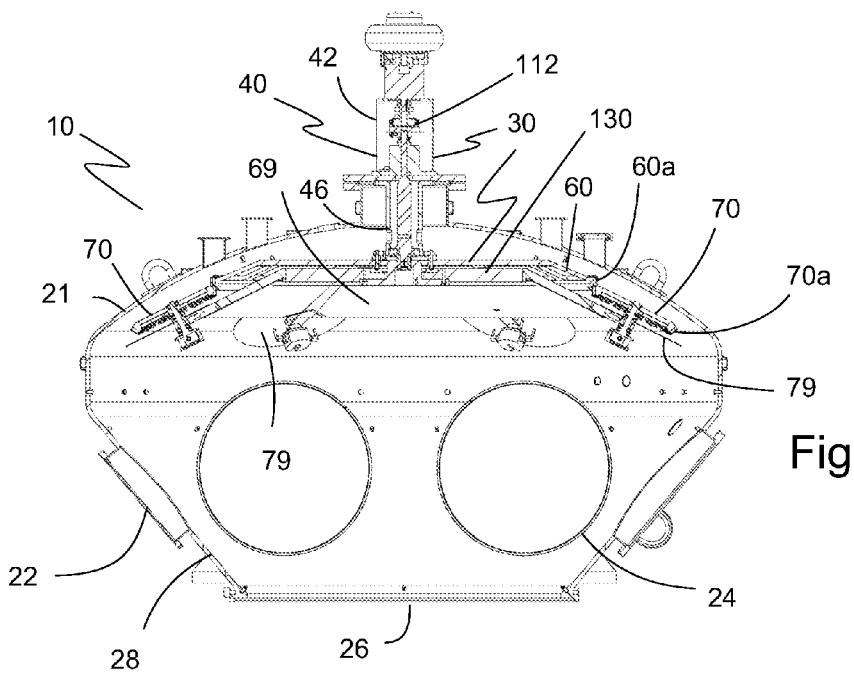
FIG. 2 is a front sectional view of a non-contact, magnetic drive assembly deposition system employing a lift-off process in a HULA orientation showing a central ring, a plurality of orbital rings, and a central drive component.

FIG. 2 is a front cross-sectional view of one embodiment of a deposition chamber 10 with non-contact magnetic drive assembly 30. The chamber housing 20 has a conical sidewall 28 that increases in radius as it approaches a rounded top 21 of chamber housing 20. One or more of ports 12 and 14 feature a flange for sealingly connecting with a vacuum system. In this embodiment, magnetic drive assembly 30 includes a center ring 60 that is stationary, a plurality of orbital rings 70 and a central drive component 40. Central drive component 40 includes an upper drive portion 42 that preferably incorporates a position indexing mechanism 112 and a lower drive portion 46 that preferably incorporates an orbital ring support and drive mechanism 130. Orbital rings 70 preferably rotate around central ring 60 and are disposed at a set radius from the center of central ring 60 such that a periphery 70a of orbital ring 70 overlaps with a periphery 60a of central ring 60. A central ring shield 69 is disposed adjacent to and below central ring 60 to minimize drive ring 60 from receiving any material being deposited onto one or more substrates during a deposition cycle. An orbital ring shield 79 is disposed adjacent to and below orbital ring 70 also to minimize orbital ring 70 from receiving any material being deposited onto the substrates. Connected to top 21 of chamber housing 20 is a central drive component 40. Chamber housing 20 also includes a chamber bottom opening 26 that connects to an electron gun assembly (not shown).

Figure 3:
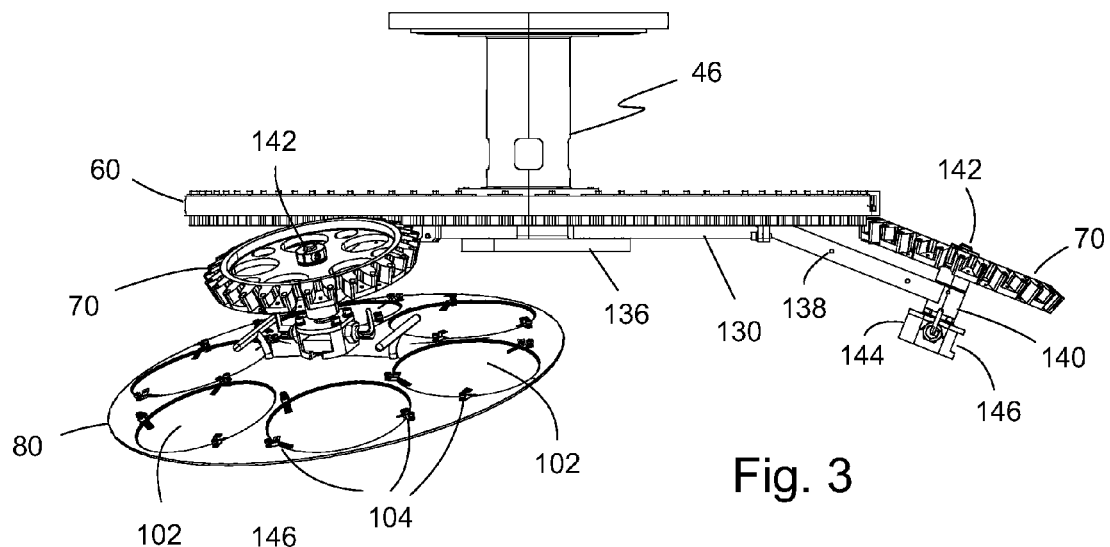
FIG. 3 is a side plan view of a portion of the central drive component disposed within the chamber volume of the deposition system chamber showing the central ring, the plurality of orbital rings and a substrate holder.

FIG. 3 shows a side plan view of central ring 60, orbital rings 70, lower drive portion 46, and substrate holder 80. This embodiment illustrates one method of connecting the substrate holder 80 to orbital ring 70. The central shaft 35 (not shown) passes into chamber volume 12 (more clearly shown in FIG. 2). An end 134 (not shown) is connected to and supports a central hub 136 with a plurality of radially extending supports, arms or spokes 138 that terminate in an angular orientation beyond and away from central ring periphery 60a at an orbital support hub 140. Orbital support hub 140 rotatably supports orbital ring 70 on a first orbital hub end 142. At a second orbital hub end 144, there is a substrate receiver slot 146 adapted for fixedly holding substrate holder 80 so that substrate holder 80 rotates with orbital ring 70. Substrate holder 80 has a plurality of substrate holder openings 102 where each holder opening 102 has a plurality of substrate holder clips 104 adapted for receiving and holding a substrate within opening 102 for processing in the deposition chamber 10.

Figure 4:
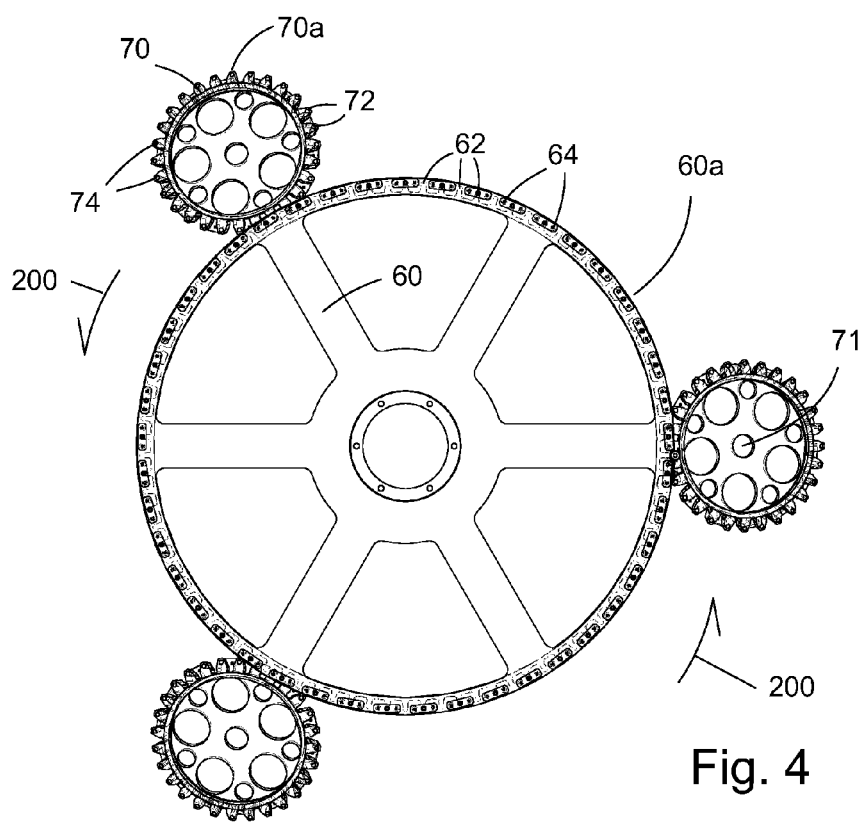
FIG. 4 is a top plan view of the central ring and the plurality of orbital rings.

FIG. 4 illustrates a top plan view of FIG. 3 but without substrate holder 80. In this preferred embodiment, central ring 60 is stationary and the plurality of orbital rings 70 rotate around central ring 60 as indicated by arrows 200. Central ring 60 has a plurality of central ring teeth 62 disposed around central ring periphery 60a. Central ring 60 also has a plurality of central ring magnets 64, each of which has North and South magnetic poles. This is more clearly shown in FIGS. 5A, 5B and 5C. Each of the plurality of orbital rings 70 is capable of rotating about its central axis 71, which extends perpendicular to the plane of orbital ring 60 and through an axial center of orbital ring 70. Each orbital ring 70 has a plurality of orbital ring teeth 72, where each tooth 72 has a magnet 74. Each of the plurality of magnets 74 has a North pole and South pole. In some embodiments, orbital rings 70 may be referred to as orbital wheels 70. Both central and orbital rings 60, 70, respectively, contain magnets 64, 74 equally spaced around their respective peripheries 60a, 70a. The spacing between magnets 74 on orbital rings 70 is equivalent to, or substantially equivalent to, the spacing of magnets 64 on the central ring 60. These are more clearly shown in FIGS. 5A-C and 6A-C.

Figure 5A:
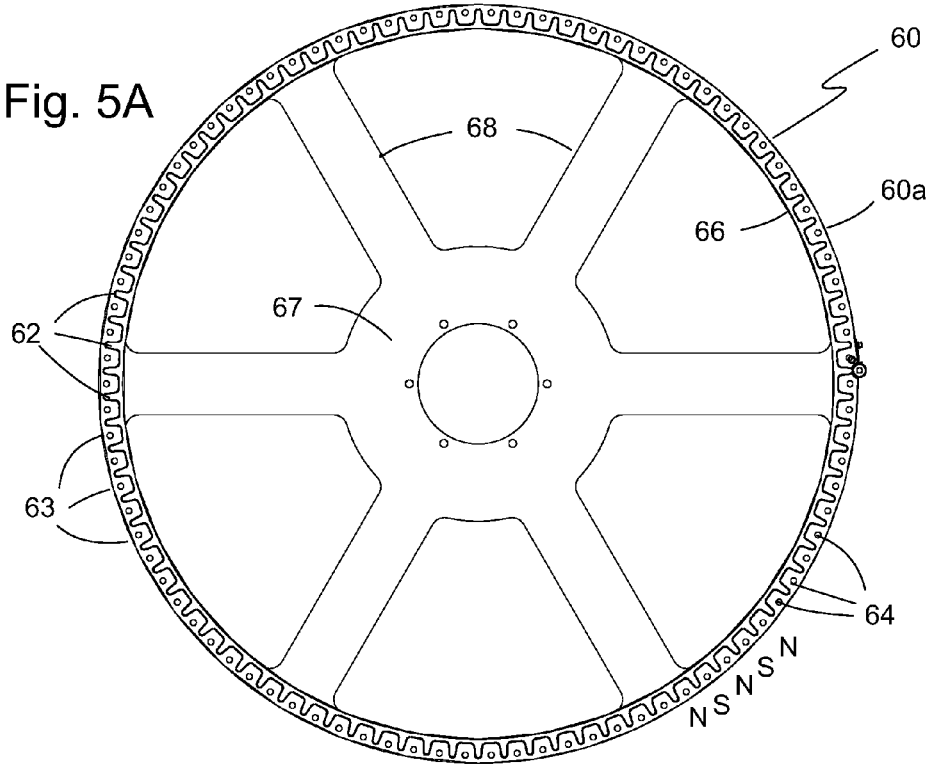
FIG. 5A is a bottom view of a central ring showing the plurality of central ring teeth disposed around the periphery and a position sensor.
Figure 5B:
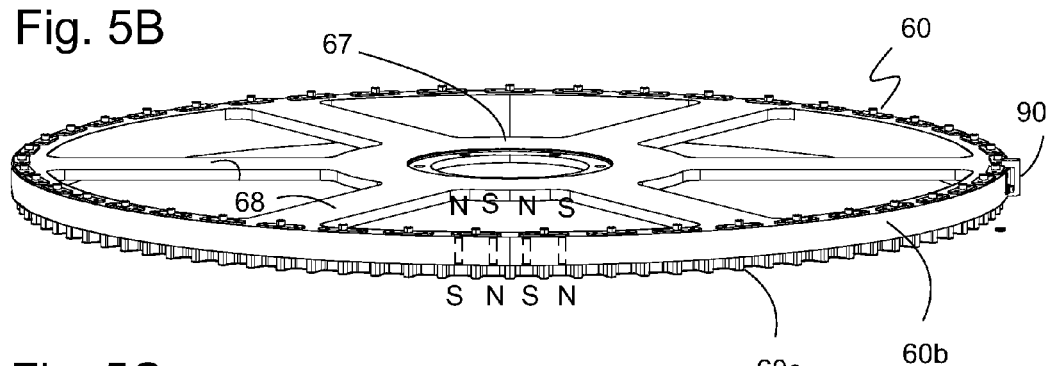
FIG. 5B is a top perspective view of the central ring shown in FIG. 5A.
Figure 5C:
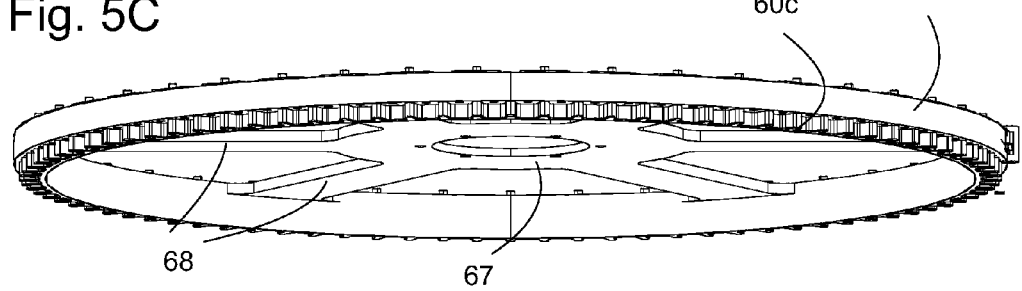
FIG. 5C is a bottom perspective view of the central ring shown in FIG. 5A.

Turning now to FIGS. 5A, 5B and 5C, there is illustrated one embodiment of central ring 60. In this embodiment, central ring 60 has a central outer ring 66, an inner central hub 67 and a plurality of central spokes 68. Around periphery 60a is disposed the plurality of central ring teeth 62. The plurality of central ring teeth 62 are equally spaced around periphery 60a defining a plurality central tooth spaces 63 or central gear slots 63. In this embodiment, a position sensor 90 is also fixedly attached at a predefined location on periphery 60a of central ring 60. Between each of the plurality of central ring teeth 62 is a plurality of central ring magnets 64. Each magnet 64 is positioned substantially within the center of the space 63 defined between adjacent central ring teeth 62. Central ring magnets 64 are placed on, attached to, or are embedded in, central ring 60 between each of the plurality of central ring teeth 64. As seen in FIGS. 5B and 5C, periphery 60a preferably has an upper outside ring portion 60b and a lower outside ring portion 60c. Upper outside ring portion 60b receives and holds the plurality of magnets 64 within magnet recesses (not shown). Preferably, the magnets are positioned in an alternating magnetic pole orientation so that a North pole of one magnet is next to a South pole of an adjacent magnet. This alternating arrangement provides greater magnetic force for driving the magnetic drive system of the present invention.

Figure 6A:
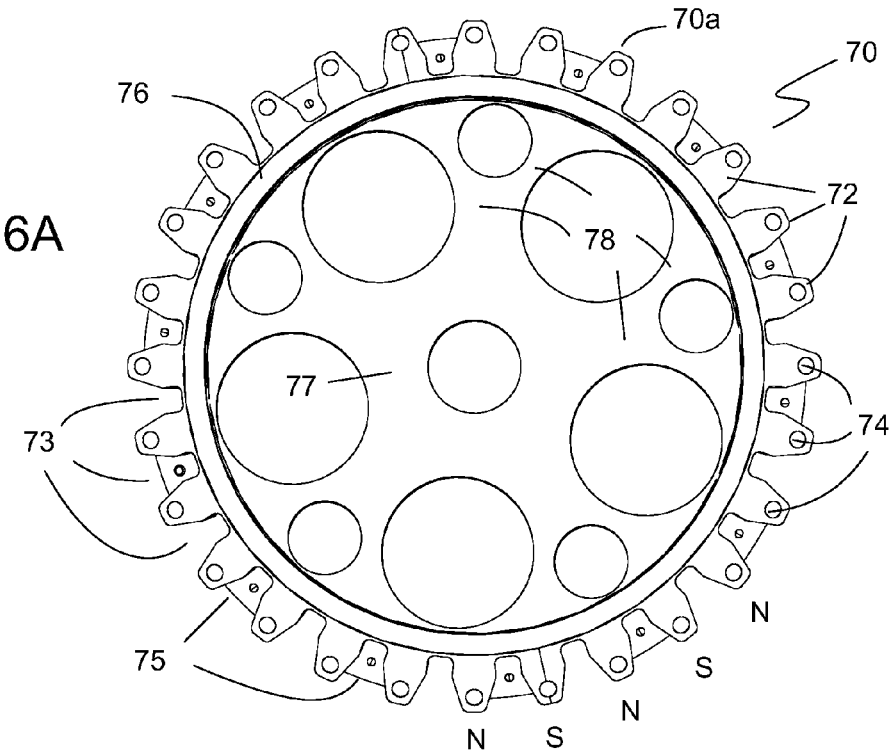
FIG. 6A is a top view of the orbital ring showing a plurality of orbital ring teeth disposed around the periphery and a plurality of magnets.
Figure 6B:
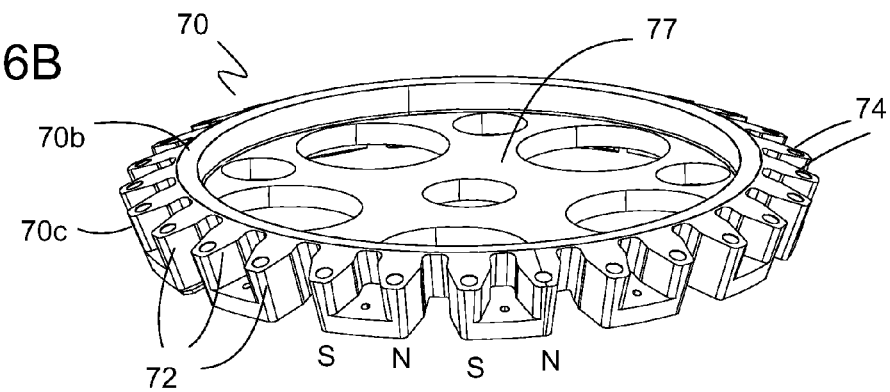
FIG. 6B is a top perspective view of the orbital ring shown in FIG. 6A.
Figure 6C:
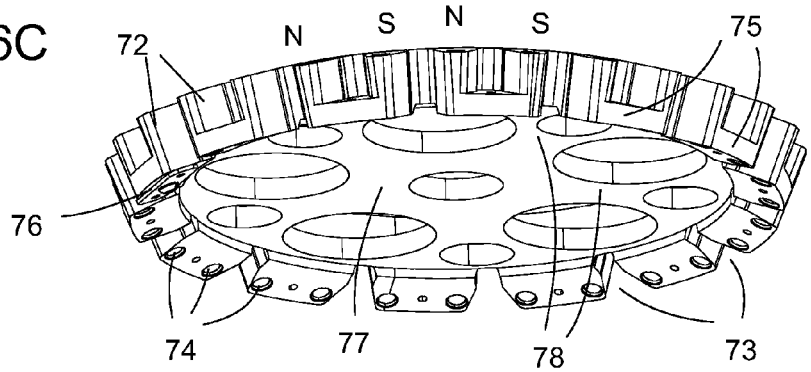
FIG. 6C is a bottom perspective view of the orbital ring shown in FIG. 6A.

FIGS. 6A, 6B and 6C illustrate one embodiment of orbital ring 70. In this embodiment, orbital ring 70 has an orbital outer ring 76, an inner orbital hub 77 and a plurality of orbital spokes 78. Around periphery 70a is disposed the plurality of orbital ring teeth 72. The plurality of orbital ring teeth 72 are equally spaced around periphery 70a defining a plurality of orbital tooth spaces 73 or orbital gear slots 73. In this embodiment, a pair of adjacent teeth 72 has an orbital tooth space 73 and the next pair of adjacent teeth 72 has a connecting ledge 75. Orbital tooth space 73 aligns with position sensor 90 of central ring 60 (which interacts with position sensing assembly 100) to indicate whether the magnetic drive is enabled and engaged or whether the mechanical drive is enabled and engaged. Connecting ledge 75 provides the basis for fastening a magnet retaining plate or magnet bridge component 76 to orbital ring 70. Orbital ring magnets 74 are placed on, attached to, or are embedded in, each of the plurality of orbital ring teeth 72. Preferably within each of the plurality of orbital teeth 72 is a plurality of orbital ring magnets 74. Each magnet 74 is positioned substantially within the center of an outer portion of each tooth 72. As seen in FIGS. 6B and 6C, periphery 70a preferably has an inner outside ring portion 70b and an outer outside ring portion 70c. Inner outside ring portion 70b supports and holds outer outside ring portion 70c that includes the plurality of orbital teeth 72 and magnets 74. Preferably, the magnets are positioned in an alternating magnetic pole orientation so that a North pole of one magnet is next to a South pole of an adjacent magnet. This alternating arrangement provides greater magnetic force for driving the magnetic drive system of the present invention.

In this embodiment, each orbital ring 70 is positioned such that the orbital ring teeth 72 interleaf with central tooth space 63 between adjacent ones of the plurality of central ring teeth 62. In this configuration, the magnetic poles of the magnets 74 in orbital ring 70 are positioned below corresponding magnetic poles of magnets 64 on central ring 60. It should also be understood that central teeth spacing 63 and orbital teeth spacing 73 must be larger than the width of each of the corresponding central teeth 62 and orbital teeth 72 so that there is defined an orbital/central ring tooth spacing between adjacent orbital ring teeth 72 and central ring teeth 62. This is required so that adjacent, interleafed teeth 62, 72 do not touch each other allowing the torque created by the interleaving, superposed magnets 62 on central ring 60 and magnets 72 on orbital ring 70 to drive the rotation of orbital ring 70 on the orbital ring central axis of rotation. In other words, the rotation is provided by the non-contact, magnetic drive mechanism.

It is understood that the central drive component in this embodiment drives the lower drive portion 46 around the stationary central ring 60 and that the rotational speed of the central drive component is substantially equal to the magnetic drive torque provided by the superposed magnets allowing the magnetic drive torque to drive the rotation of the orbital ring 70. This non-contact, magnetic drive mechanism continues until the rotation speed of the central drive component differs from the magnetic drive torque of the superposed magnets 64, 74. This difference may occur from sudden acceleration or deceleration or from frictional forces due to sticking bearings. In the event that the rotational speed of the central drive component, which in this embodiment drives the lower drive portion 46 around the stationary central ring 60, differs from the magnetic drive torque of the superposed magnets 64, 74, the superposed magnets 64, 74 decouple. When decoupling occurs, the mechanical drive system/mechanism becomes enabled and the central ring teeth 62 and orbital ring teeth 72 mechanically and physically interact (i.e. contact each other) to continue driving the rotation of orbital ring 70 on its own orbital ring axis as well as around the stationary central ring 60 to prevent loss of substrates undergoing deposition, which loss may be rather expensive in terms of materials and lost processing time.

Figure 7:
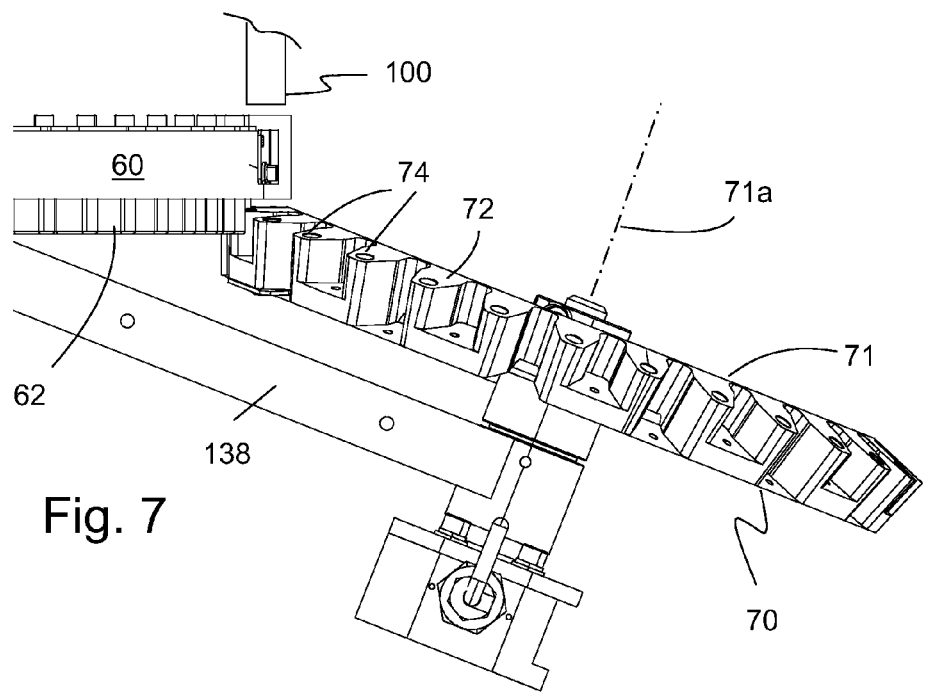
FIG. 7 is a side plan view of a portion of the HULA system showing the central ring, the orbital ring and a portion of the sensor assembly of the present.

Turning now to FIG. 7, there is illustrated an enlarged view of the spatial relationship of orbital ring 70 to central ring 60 at their respective peripheries 70a, 60a. The orbital teeth 72 are angled with respect to the plane (i.e. the top surface 71 of the orbital ring 70. Because the orbital rings 70 are typically angled downward with the contour of the rounded top of the deposition chamber, this angle permits efficient engagement with central teeth 62 of the central ring 60.

The orbital ring 70 rotates (i.e., spins on its central axis 71a) as it moves around the periphery 60a of the stationary central ring 60. To accomplish this double-axis rotation, the orbital ring 70 is positioned such that the poles of the orbital ring magnets 74 pass under the poles of the central ring magnets 64. As shown in FIGS. 5 and 6, for example, this alignment of the magnetic poles provides an attractive or repulsive force between the magnets 64 on central ring 60 and the magnets 74 on orbital rings 64. This attractive or repulsive force creates a driving force that makes orbital rings 70 rotate on the orbital ring central axis 71a when orbital rings 70 are moved about the periphery 60a of central ring 60 by supporting arm 138.

In one embodiment, the magnetic drive mechanism has magnets 64, 74 installed in alternating (North-South) arrangements on each ring 60, 70. This arrangement aids in providing additional driving torque because the opposite poles of adjacent magnets 64, 74 repel one another. The repulsive force adds to the main attractive forces of the magnets 64, 74 located directly opposite each other to drive the rotation of orbital ring 70. This arrangement also allows two adjacent magnets 64 or 74 to be bridged together to increase the strength of the magnetic force at their faces. This configuration is not required, but provides additional magnetic coupling forces and re-coupling forces.

This non-contact magnetic driving force drives the orbital rings 70 so long as the driving torque required to accelerate or rotate the rings 70 does not differ from the coupling force of the magnets 64, 74. If the driving torque for a rotating ring 62 differs from the magnet coupling force for that ring, the rotating ring 70 will magnetically decouple. Without the mechanical drive mechanism of the present invention, the decoupled ring 70 would then freewheel, and therefore spin at an inconsistent speed. The decoupled ring 70 would most likely slow down and not recouple.

Decoupling can be caused by multiple factors, such as accelerating or decelating too fast, inconsistent or jerky speed control, a sticky, or a binding bearing that results in higher drag force, for example.

Figure 8:
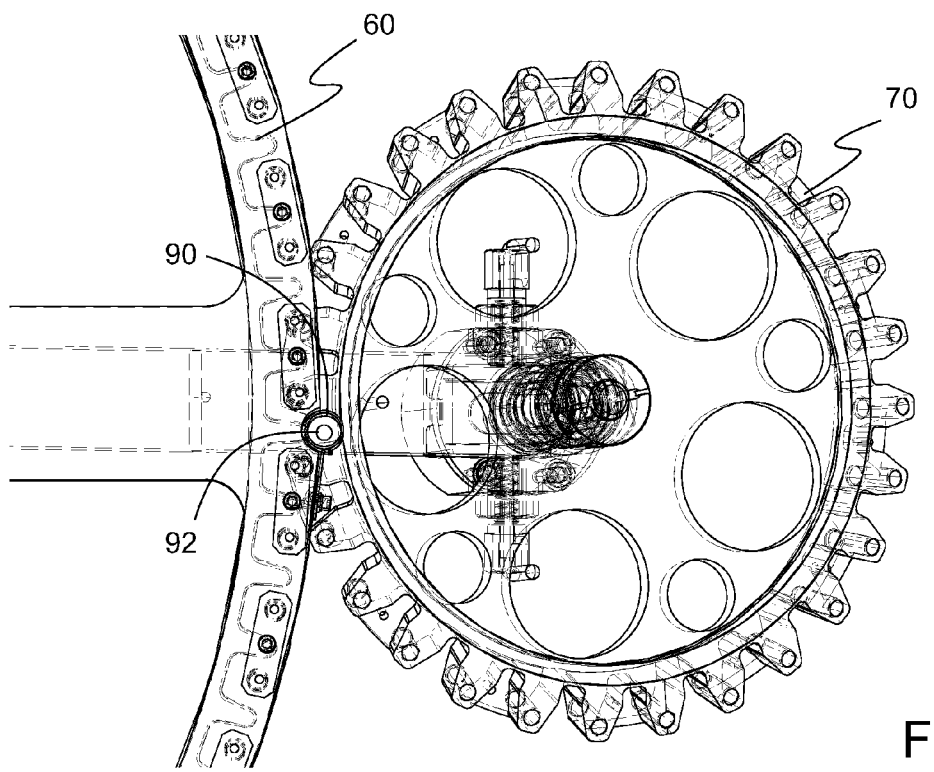
FIG. 8 is a top plan view of the central ring and the orbital ring showing the relationship of the central ring teeth, the orbital ring teeth and the position sensor when the magnetic drive is functioning.

The present invention provides a mechanical drive arrangement that has an atypically large amount of play, or space, 63, 73 between the mating teeth or gears 62, 72. This play is sometimes called backlash. The gear space 63, 73 allows the teeth or gears 62, 72 to move back and forth a controlled amount. The magnetic force will center and maintain alignment of the rings 60, 70 such that the gear teeth 72 of the orbital ring 70 will be centered within the space 63 between central or gear teeth 62 on the central ring 60. As shown in FIG. 8, for example, the interleafing results in gaps 160 between the leading edges 62a, 72a and trailing edges 62b, 72b of each interleaved gear tooth 62, 72, respectively. Under this condition, there is no mechanical (or physical) contact between the gear teeth 62, 72. This is the normal and desired operating mode during which the magnets 64, 74 drive (i.e. rotate) the orbital rings 70.

Figure 9:
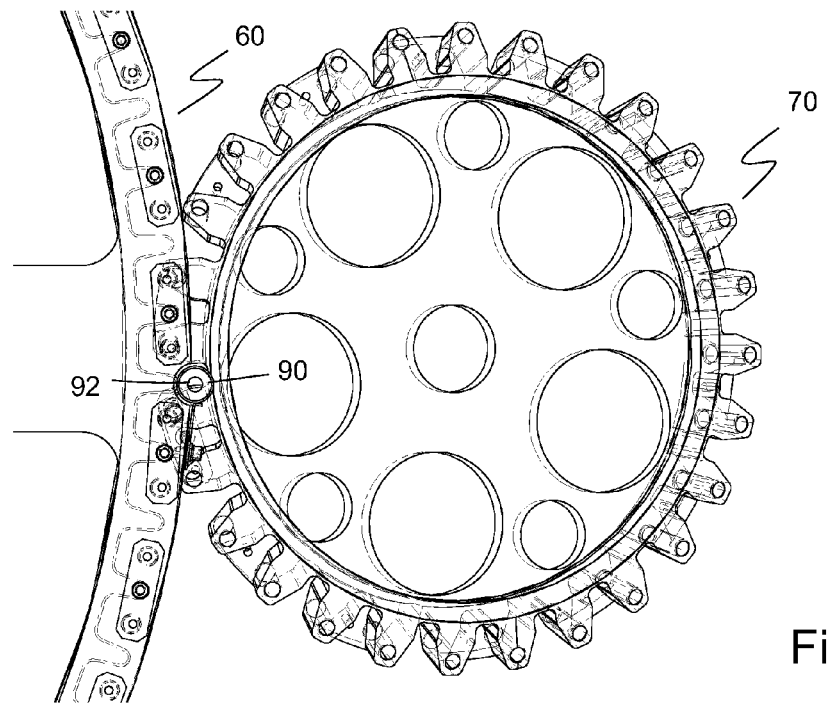
FIG. 9 shows a top plan view of the central ring and the orbital ring showing the relationship of the central ring teeth, the orbital ring teeth and the position sensor when the mechanical drive is functioning.
Figure 10:
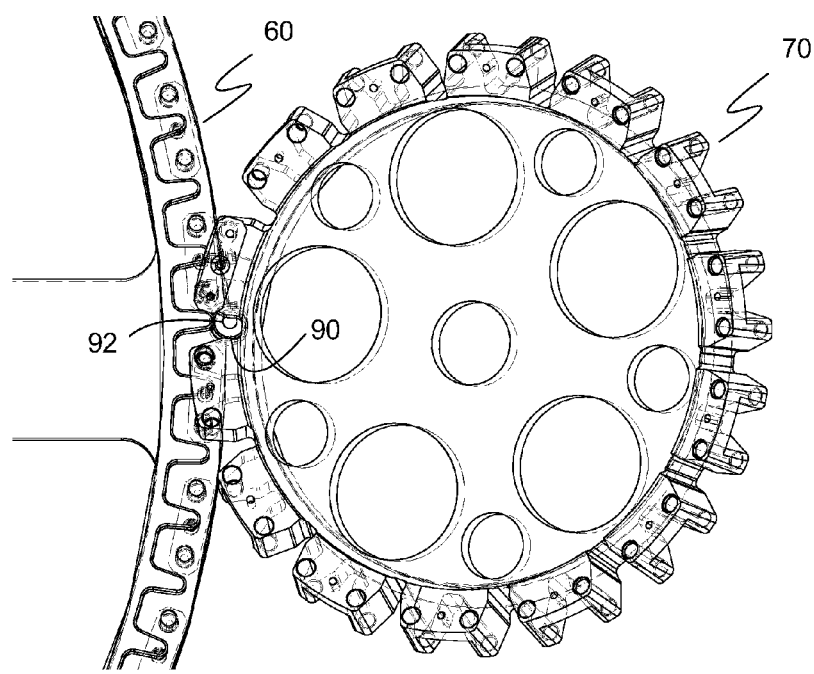
FIG. 10 is a bottom plan view of the central ring and the orbital ring showing the relationship of the central ring teeth, the orbital ring teeth and the position sensor when the mechanical drive is functioning.

Under adverse conditions such as during quick acceleration, quick deceleration, an inconsistent rotating speed, or a sticky or failing bearing, for example, the magnetic coupling force may be decoupled. As shown in FIGS. 9 and 10, the central teeth 62 and orbital teeth 72 then engage each other, ensuring that the orbital ring 70 continues rotating at the desired speed. When the adverse condition ceases, the magnetic forces recouple and resume control over the movement of the orbital ring 70 with the orbital teeth 72 on the orbital ring 70 centered between the central teeth 62 of the central ring 60. This returns the system to a non-contact, magnetic drive arrangement.

The amount of play between the gear teeth 62, 72 should be limited in order to maintain opposing, superposed magnets 64, 74 in relative alignment. This alignment allows the magnets 64, 74 to maintain a strong coupling force capable of re-centering the interleaved central and orbital ring teeth 62, 72 in the event of a decoupling. If the gap 160 between gear teeth 62, 72 is too large, the magnetic force becomes sufficiently reduced so that the magnets 64, 74 are unable to re-center the gear teeth 62, 72 in the corresponding gear slots 73, 63.

The central and orbital teeth 62, 72 of the magnetic drive assembly are intended primarily for safety and come into contact under atypical or very rare occasions, such as during a bearing failure. This design allows for the non-contact drive to be used during normal operation, while transitioning to a positive or mechanical or contact drive system very briefly under abnormal situations, for example. This feature allows the process to be completed without loss of the product being processed within the system 10.

Figure 13:
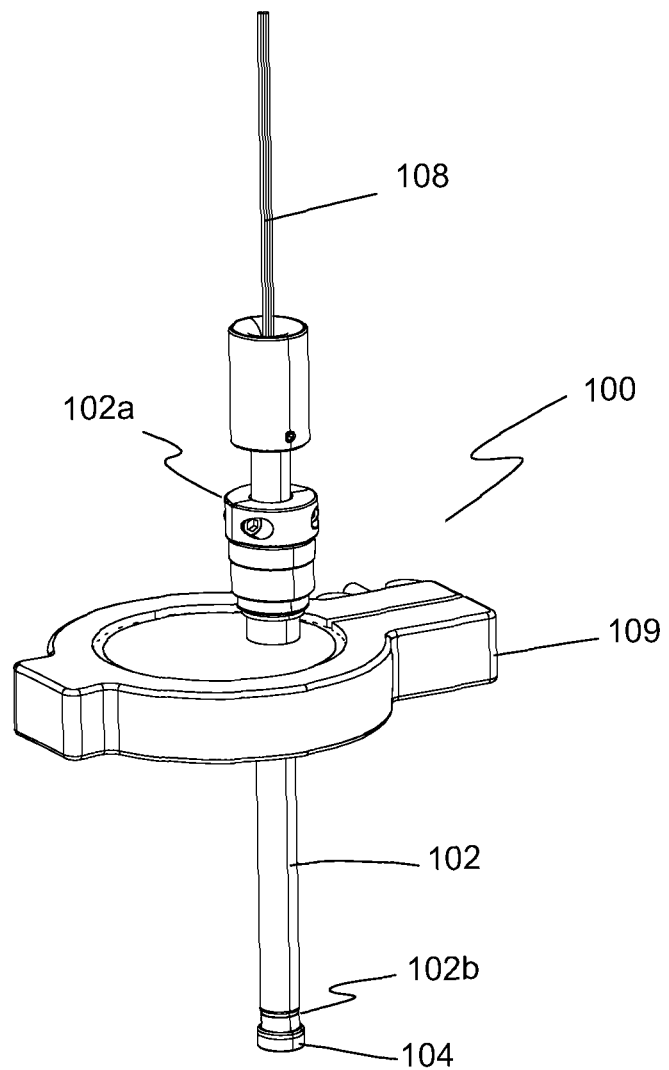
FIG. 13 is a top perspective view of a position sensing assembly for optically coupling with a position sensor of a central ring.

As shown in FIGS. 7 and 13, for example, the drive assembly may also include a position sensing assembly 100 to indicate when decoupling of the magnetic coupling force has occurred and when the central and orbital teeth 62, 72 are driving the rotation of the orbital rings 70. This position sensing assembly 100 alerts the operator to service the system at the next convenient opportunity. The position sensing assembly 100 is not required, but is an additional feature present in some embodiments.

As shown in FIGS. 7-10, the position sensor 90 optically interacts with the position sensing assembly 100. When the magnetic drive mechanism is working properly as illustrated in FIG. 8, the center 92 of the position sensor 90 can be clearly seen between the orbital ring teeth 72. The position sensing assembly 100 optically interacts with the position sensor 90 indicating that the magnetic drive mechanism is rotating the orbital ring 70. FIGS. 9 and 10 show both a top and bottom view of the position sensor 90. In these illustrations, the mechanical drive mechanism has taken over the rotational driving of orbital ring 70. As can be seen, the center 92 of position sensor 90 is now partially occluded. This partial occlusion interrupts/interferes with the laser of the position sensing assembly 100. When this occurs, an alert signal is presented to the operator indicating that the magnets 64, 74 have decoupled and the mechanical drive mechanism has been enabled.

The central drive component 40 uses gentle acceleration and deceleration profiles to maintain magnetic coupling between magnets 64 on the central ring 60 and magnets 74 on the orbital rings 70. Because of these profiles, mechanical contact between the rings 60, 70 typically only occurs under abnormal conditions. The central drive component 40 will, however, allow for higher acceleration and deceleration speeds to occur. During these conditions, the central drive component 40 uses the mechanical gears or teeth 62, 72 for a short time to achieve higher acceleration rates. It then quickly transitions to non-contact magnetic drive mode for the remainder for the rotation cycle.

As shown in FIGS. 6-10, for example, the teeth 72 of the orbital rings 70 preferably have a tooth profile that provides for smooth engagement and disengagement. The teeth 72 have a trapezoidal shape with rounded corners. This trapezoidal shape allows the mechanism to run smoothly if the gear teeth 72, 62 should come into contact with each other. This tooth profile is not required, but allows for smoother operation under the atypical contact conditions.

In one embodiment of the present invention, the central ring 60 may be rotated while the orbital ring 70 being rotatable about its axis is in a fixed spatial location relative to the rotating central ring 60. In such an embodiment, central ring 60 may be driven at the inner-most portion of the central ring 60 by a central drive shaft such as drive shaft 35 from the central drive component 46. Alternately, the central ring 60 may be driven at the outer-most portion of the central ring 60 at its periphery 60a.

In one embodiment of the present invention, the central ring 60 is stationary while an arm 138 moves the orbital rings 70 about the periphery 60a of the central ring 60. This configuration allows the orbital rings 70 to move about the process chamber 10 while also spinning on their own axes.

In another embodiment, the central ring 60 may rotate about its central axis in addition to having the orbital rings 70 moving about the periphery 60a of the central ring 60. In other words, both the central ring 60 and the orbital rings 70 are rotating but at different speeds to accomplish the coating efficiency desired.

Figure 11A:
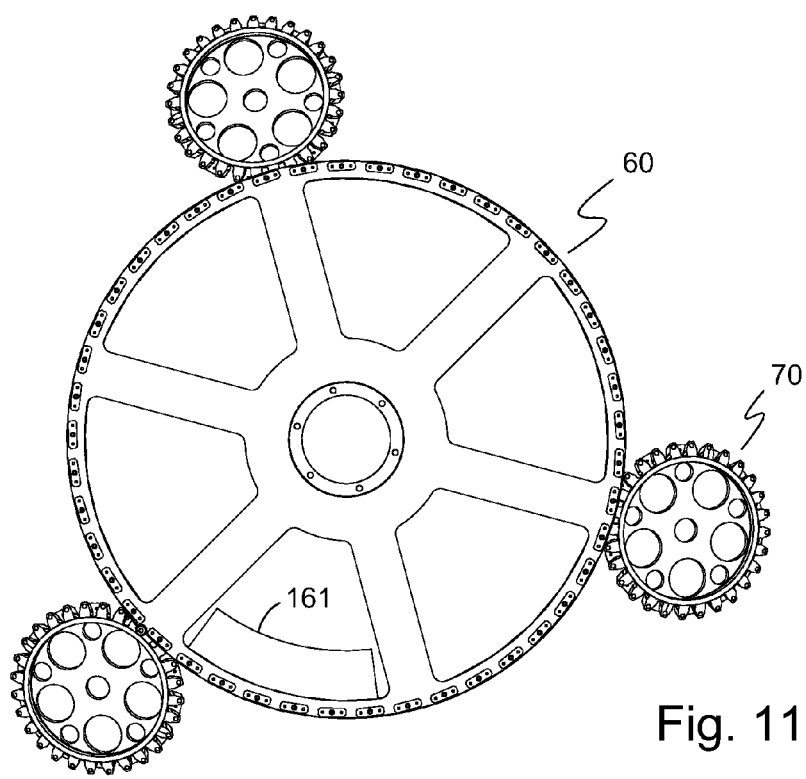
FIG. 11A is a top plan view of the central ring and the plurality of orbital rings showing a removable central ring block.
Figure 11B:
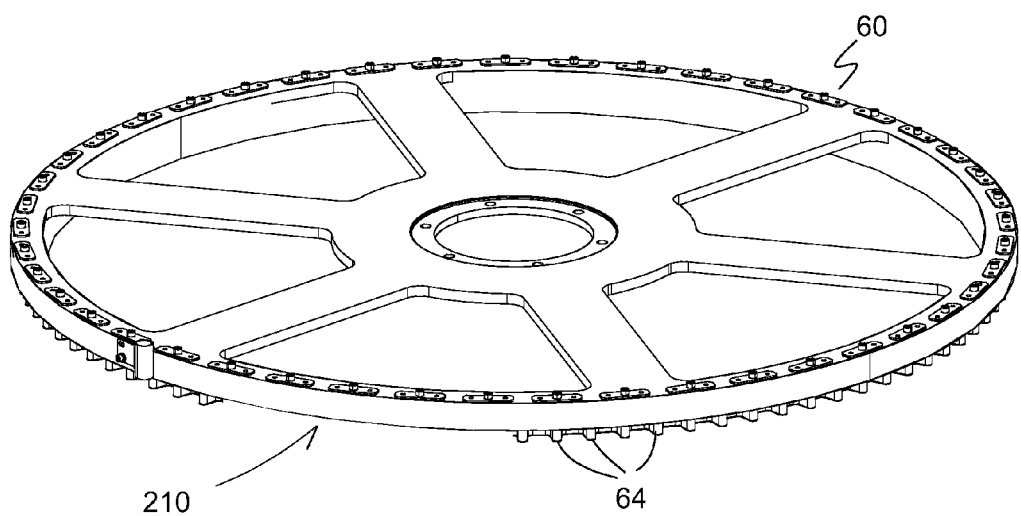
FIG. 11B is a top perspective view of the central ring showing the central ring block removed.

Referring to FIGS. 11A-B, another embodiment of the central ring 60 features a removable block 161 with a plurality of gear teeth 162 to allow the orbital ring 70 to be rotated by hand. When the removable block is removed as seen in FIG. 11B in an areas indicated by arrow 210, the central ring 60 does not have gear teeth 64 present to engage the teeth 74 of the orbital ring 70. As a result, the user may freely rotate the orbital ring 70 to a desired position. After setting the desired position, the user may then replace the removable block 161. This feature permits the user to orient the orbital rings 70 for easier loading and unloading.

Figure 12A:
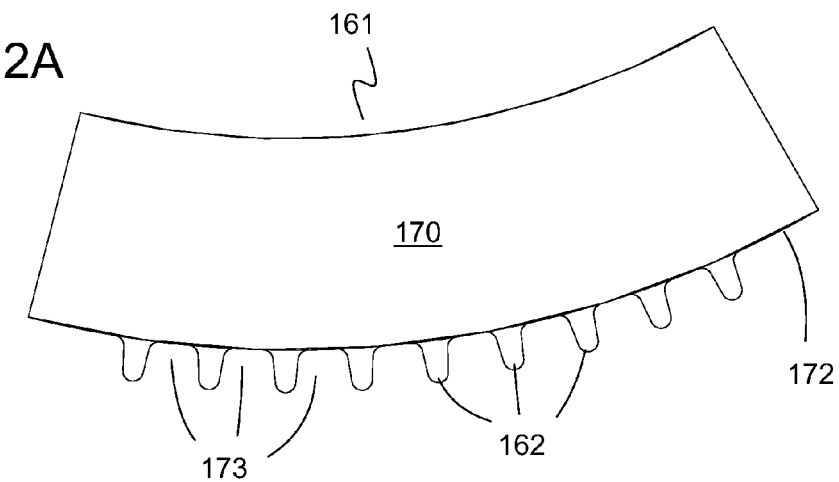
FIG. 12A is a top plan view of an embodiment of a central ring block shown in FIG. 11A.
Figure 12B:
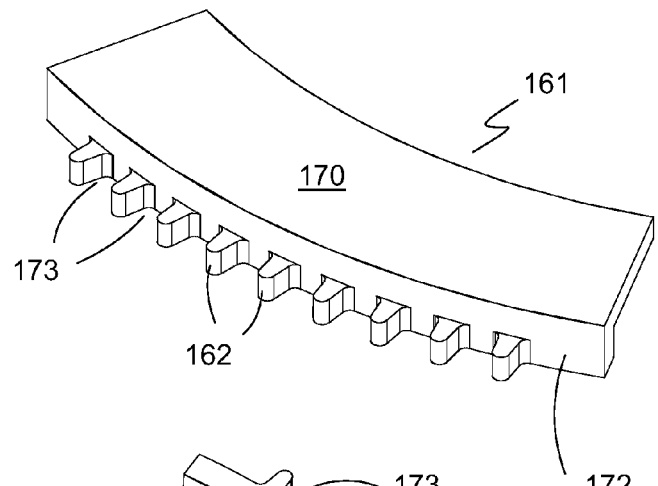
FIG. 12B is a top perspective view of the central ring block shown in FIG. 12A.
Figure 12C:
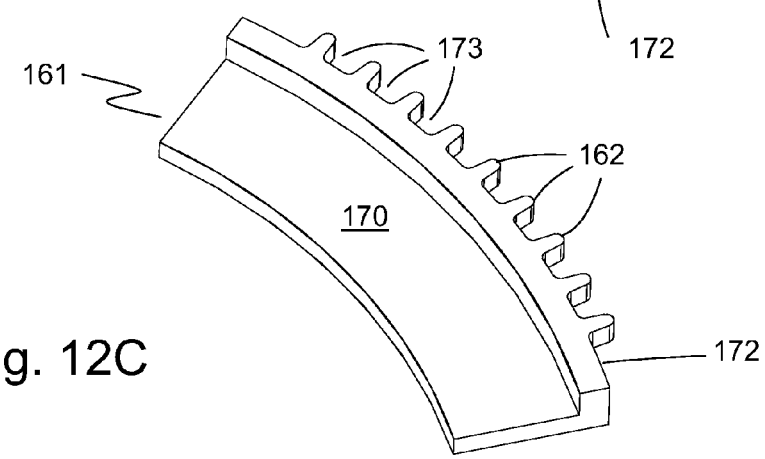
FIG. 12C is a bottom perspective view of the central ring block shown in FIG. 12A.

FIGS. 12A-C illustrate one embodiment of removable block 161. FIG. 12A is a top plan view of removable block 161 having a block body 170, an arcuate outer block edge 172 and a plurality of equally spaced teeth 162 extending from block edge 172. The curvature (i.e. radius) of the arcuate outer block edge 172 is substantially similar to the curvature of periphery 60a of central ring 60. The spacing 173 between the equally-space teeth 162 is also substantially similar to the spacing 63 of the central ring teeth 62 of central ring 60.

FIG. 13 illustrates one embodiment of the position sensing assembly 100. Position sensing assembly 100 includes a sensor assembly body 102 with a first sensor body end 102a and a second body end 102b at an opposite end of sensor body 102, and a fiber optic wire(s) 108 connected to a first sensor body end 102a. A sensor tip 104 is disposed at second body end 102b. Sensor assembly body 102 is supported by sensor body support 109 for mounting through the top 21 of chamber housing 20. Sensor tip 104 is positioned proximate to periphery 60a of central ring 60 so that sensor tip 104 is capable of being optically coupled with position sensor 90 attached to periphery 60a. It is the optical coupling of position sensing assembly 100 and position sensor 90 that indicates to an operator of the deposition system whether the mechanical drive mechanism has been enabled and engaged instead of the normal non-contact, magnetic drive mechanism.

Figure 14:
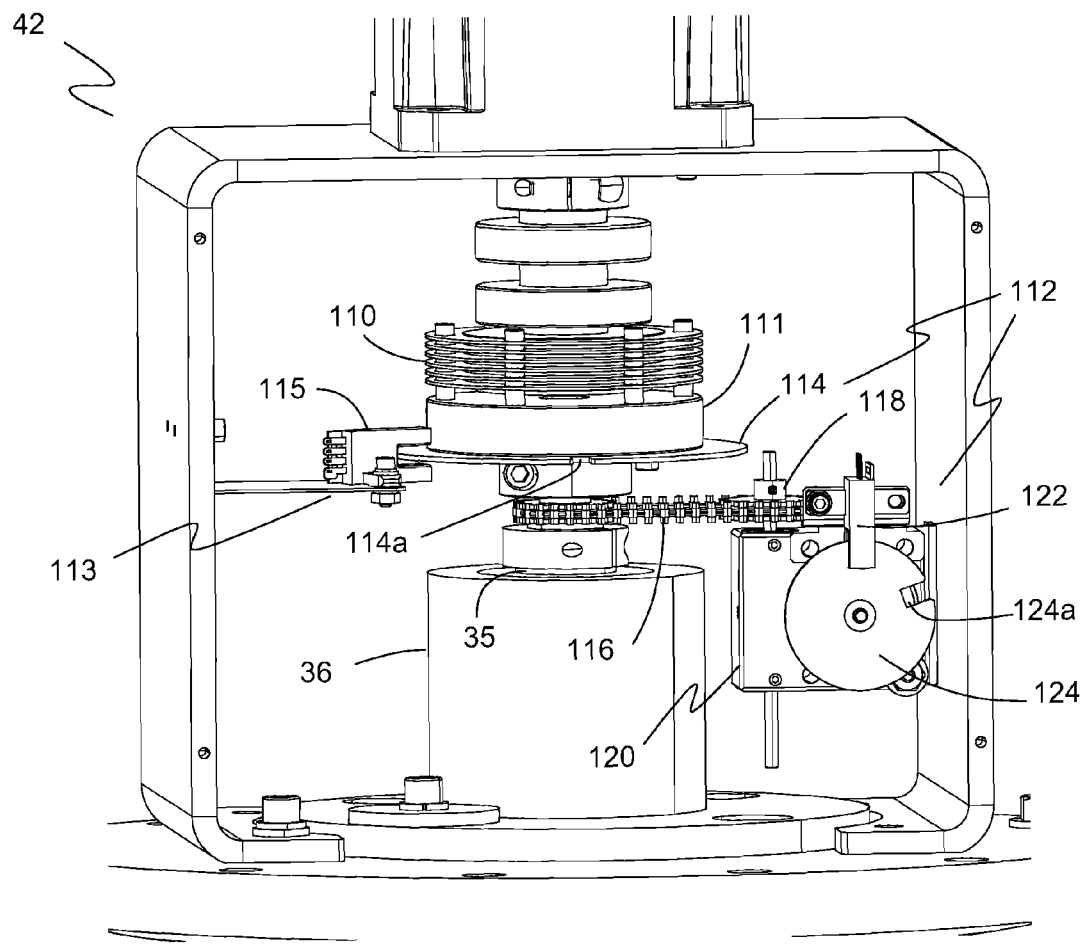

Turning now to FIG. 14, there is illustrated upper drive portion 42 of control drive component 40 containing an indexing mechanism 112. Upper drive portion 42 includes a clutch 110 that contacts a friction plate 111 to rotate a center cylindrical shaft 35. Below the friction plate 111 is indexing mechanism 112. Indexing mechanism 112 includes a center shaft home position assembly 113 and a center ring home position assembly 120. Center shaft home position assembly 113 includes a center shaft home sensor plate 114 and a shaft home sensor 115. Shaft home sensor plate 114 rotates with center shaft 35 and includes a shaft home position notch 114a that interacts with shaft home sensor 115 to indicate the home position of center shaft 35 when position notch 114a is aligned with shaft home sensor 115. Center ring home position assembly 120 includes a non-slip timing belt 116 that links shaft 35 to a pulley 118 and a gear reducer assembly 120. Pulley 118 drives gear reducer assembly 120, which includes a central ring home sensor 122 and a central ring home sensor disk 124. Central ring home sensor disk 124 rotates as pulley 118 drives gear reducer assembly 120 and further includes a sensor disk notch 124a. Sensor disk notch 124a interacts with central ring home sensor 122, which is in a fixed position attached to gear reducer assembly 120, to indicate the home position of central ring 60 when sensor disk notch 122 is aligned with central ring home sensor 122. The home position of central ring 60 is relative to a substrate holder load/unload position in the vacuum deposition chamber 10. Center shaft 35 passes through a feed-through 36 into the interior of the chamber 10. The arms 138 connect to the central shaft 35 to rotate the arms 138, and therefore the orbital rings 70, around the stationary central ring 60.

In conjunction with, or instead of the removable gear block 161, another embodiment of the drive assembly features a gear ratio between the central and orbital rings 60, 70. The respective positions of the center and orbital rings 60, 70 repeat when the support arms 138 rotate the orbital rings 70 fourteen times around the perimeter 60a of the central ring 60. During these fourteen revolutions, the orbital rings 70 each rotate forty-five times. After the orbital rings 70 are aligned properly during assembly, the system can return to this "home" position for loading and unloading by using a 14:1 gear box 120 to keep track of this fourteenth-revolution home position. This gear ratio is not required for the invention, but it aids in loading and unloading. Other gear ratios could be used as well. Table 1, below, provides the ratio of stationary ring magnets to orbital rotating ring magnets for one embodiment of the present invention. Table 2, below shows the relationship between the number of revolutions of the center shaft 35 and the orbital ring 70 based on the information in Table 1.

TABLE 1

| No. Magnets on center stationary ring | 90 |
|---|---|
| No. Magnets on orbital ring | 28 |
| Ratio (magnets) | 3.214 |

TABLE 2

| | # of Revolutions for Center shaft | | | | | | | |
|---|---|---|---|---|---|---|---|---|
| | 0 | 1 | 2 | 3 | 4 | 5 | 6 | 7 | 8 |
| # of Revolutions for Small ring | 0.000 | 3.214 | 6.429 | 9.643 | 12.857 | 16.071 | 19.286 | 22.500 | 25.714 |

| | # of Revolutions for Center shaft | | | | | | | |
|---|---|---|---|---|---|---|---|---|
| | 9 | 10 | 11 | 12 | 13 | 14 | 15 | 16 |
| # of Revolutions for Small ring | 28.929 | 32.143 | 35.357 | 38.571 | 41.786 | 45.000 | 48.214 | 51.429 |

As shown in Table 2, for every fourteen revolutions of the center shaft 35, the substrate holders 80 (also known as domes 80 or orbital carriers 80) complete forty-five revolutions.

During initial set up of this embodiment, a substrate holder 80 connects to the load/unload slot 146 on the hub 140 as shown in FIG. 3. The user mechanically faces the dome load/unload slot 146 towards the front of the chamber 10 as shown in FIG. 2. Next, the user rotates the center shaft 35 one-third of a revolution and mechanically sets the second dome load/unload slot 146 at the front of the chamber 10. Next, the user again rotates the center shaft 35 one-third of a revolution and mechanically sets the third dome load/unload slot 146 at the front position. The user may perform these steps during assembly to set a "home" position. It is contemplated that the non-contact, magnetic drive assembly may have any number of orbital rings disposed about periphery 60a of central ring 60 depending on the size of the central ring, the orbital rings and the substrate holders. For example, there may be six orbital rings, which would change the loading/unloading shaft rotation to one-sixth of a rotation for each orbital ring.

During operation, when the center shaft 35 rotates fourteen revolutions, the substrate holder 80 completes forty-five revolutions and the first dome load/unload slot 146 faces the front of the chamber 10. For every forty-five revolutions of the substrate holder 80 (i.e. fourteen revolutions of the central ring 60 in this particular embodiment), the first substrate load/unload slot 146 faces the front of chamber 10.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A non-contact, magnetic drive assembly for a vacuum deposition system employing a lift-off process, the drive assembly comprising:
   a central ring having a plurality of equally-spaced central ring teeth disposed around the central ring a predefined radial distance from a center of the central ring defining a central teeth spacing, and a plurality of equally-spaced, central ring magnets wherein each one of the plurality of magnets is coupled to the central ring a predefined radial distance from a center of the central ring along one of a radial axis of the central ring teeth or a radial axis of the central teeth spacing;
   an orbital ring rotatable about an orbital ring central axis, the orbital ring having a plurality of equally-spaced, orbital ring teeth disposed around the orbital ring a predefined radial distance from a center of the orbital ring defining an orbital teeth spacing wherein the orbital ring teeth are positioned to coincide with the central teeth spacing, and a plurality of equally-spaced, orbital ring magnets wherein each one of the plurality of orbital ring magnets is disposed on the orbital ring a predefined radial distance from a center of the orbital ring along (1) a radial axis of the orbital ring teeth when each of the corresponding plurality of magnets of the central ring is disposed along the radial axis of the central teeth spacing or (2) a radial axis of the orbital ring spacing when each of the corresponding plurality of magnets of the central ring is disposed along the radial axis of the central ring teeth wherein each of the plurality of orbital ring magnets in turn becomes superposed with a corresponding magnet of the plurality of central ring magnets as the orbital ring rotates about the orbital ring central axis, the central teeth spacing and the orbital teeth spacing being larger than the width of each of the corresponding central ring teeth and orbital ring teeth wherein the interleaving of the orbital ring teeth and the central ring teeth defines an orbital/central ring tooth spacing between adjacent orbital ring teeth and central ring teeth; and
   a central drive component adapted to drive one of the central ring, the orbital ring around the central ring or both simultaneously, the central drive component providing a rotational speed that allows non-contact, magnetic drive rotation of the orbital ring around the central ring until a difference between the magnetic drive torque provided by the superposed magnets and the rotational speed of the central drive component causes the superposed magnets to decouple enabling mechanical drive rotation by the interactive contact between the central ring teeth and the orbital ring teeth.

2. The drive assembly of claim 1 wherein the plurality of central ring magnets are arranged in an alternating configuration of north-south poles.

3. The drive assembly of claim 2 further comprising a magnet bridge component directly connecting two adjacent magnets and bridging the magnetic force of each magnet to each other.

4. The drive assembly of claim 1 wherein each one of the plurality of central ring magnets is coupled to one of the central teeth spacing.

5. The drive assembly of claim 1 wherein each one of the plurality of central ring magnets is coupled to one of the central ring teeth.

6. The drive assembly of claim 1 wherein the plurality of orbital ring magnets are arranged in an alternating configuration of north-south poles.

7. The drive assembly of claim 6 further comprising a magnet bridge component directly connecting two adjacent magnets and bridging the magnetic force of each magnet to each other.

8. The drive assembly of claim 1 wherein each one of the plurality of orbital ring magnets is coupled to one of the orbital teeth spacing when each of the plurality of central ring magnets is coupled to one of the central ring teeth.

9. The drive assembly of claim 1 wherein each one of the plurality of orbital ring magnets is coupled to one of the orbital ring teeth when each of the plurality of central ring magnets is coupled to one of the central ring spacing.

10. The drive assembly of claim 1 further comprising a magnetic drive indicator system adapted to differentiate when the non-contact magnetic drive rotation is enabled and when the mechanical drive rotation is enabled.

11. The drive assembly of claim 8 wherein the magnetic drive indicator system further comprising:
    a rotation sensor disposed along and coupled to the periphery of the plurality of central ring teeth when the central ring is driven by the central drive component; and
    a rotation sensor assembly disposed in a fixed location apart from the central ring wherein the rotation sensor assembly is adapted to align with the rotation sensor upon each revolution of the central ring, the orbital ring teeth configured to provide non-interrupted alignment of a signal between the rotation sensor and the rotation sensor assembly when the non-contact magnetic drive rotation is enabled and to provide interrupted alignment of the signal when mechanical drive rotation is enabled.

12. The drive assembly of claim 1 wherein the central drive component includes a central ring home sensor assembly connected to a drive shaft of the central drive component.

13. The drive assembly of claim 12 wherein the central ring home sensor assembly includes a central ring home sensor and a rotatable central ring home sensor disk adapted to align a position indicator on the home sensor disk with the home sensor when the orbital ring is positioned at a location on the periphery of the central ring when the orbital ring is aligned with a loading and unloading access port of a vacuum deposition system.

14. The drive assembly of claim 13 further comprising a drive shaft home sensor assembly that includes a drive shaft sensor and a rotatable drive shaft sensor disk coupled to the drive shaft and adapted to align a position indicator on the drive shaft sensor disk with the drive shaft sensor that corresponds with the alignment of the home sensor disk position indicator and the central ring home sensor.

15. The drive assembly of claim 1 wherein the central ring has a removable block containing a predefined portion of the plurality of central ring teeth.

16. A method of increasing throughput in a lift-off process vacuum deposition system while minimizing particulate contamination and incomplete batching of silicon wafers, the method comprising:
    obtaining a non-contact, magnetic drive HULA assembly with mechanical stop elements wherein a plurality of magnets are coupled in an annular orientation to each of a central ring and an orbital ring that provides for each of the plurality of orbital ring magnets in turn becoming superposed with a corresponding magnet of the plurality of central ring magnets as the orbital ring rotates about an orbital ring central axis and wherein a central drive component of the HULA assembly is adapted to drive one of the central ring, the orbital ring around the central ring or both simultaneously wherein the central drive component provides a rotational speed that allows non-contact, magnetic drive rotation of the orbital ring around the central ring until a difference between a magnetic drive torque provided by the superposed magnets of the central ring and the orbital ring and the rotational speed of the central drive component causes the superposed magnets to decouple enabling mechanical drive rotation by interactive contact between a plurality of central ring teeth and a plurality of orbital ring teeth; and installing the HULA assembly in a vacuum chamber of a lift-off process vacuum deposition system.

17. The method of claim 16 wherein the obtaining step further includes a magnetic drive HULA assembly comprising:
   a central ring having a plurality of equally-spaced central ring teeth disposed around the central ring a predefined radial distance from a center of the central ring defining a central teeth spacing, and a plurality of equally-spaced, central ring magnets wherein each one of the plurality of magnets is coupled to the central ring a predefined radial distance from a center of the central ring along one of a radial axis of the central ring teeth or a radial axis of the central teeth spacing; and
   an orbital ring rotatable about an orbital ring central axis, the orbital ring having a plurality of equally-spaced, orbital ring teeth disposed around the orbital ring a predefined radial distance from a center of the orbital ring defining an orbital teeth spacing wherein the orbital ring teeth are positioned to coincide with the central teeth spacing, and a plurality of equally-spaced, orbital ring magnets wherein each one of the plurality of orbital ring magnets is disposed on the orbital ring a predefined radial distance from a center of the orbital ring along (1) a radial axis of the orbital ring teeth when each of the corresponding plurality of magnets of the central ring is disposed along the radial axis of the central teeth spacing or (2) a radial axis of the orbital ring spacing when each of the corresponding plurality of magnets of the central ring is disposed along the radial axis of the central ring teeth wherein each of the plurality of orbital ring magnets in turn becomes superposed with a corresponding magnet of the plurality of central ring magnets as the orbital ring rotates about the orbital ring central axis, the central teeth spacing and the orbital teeth spacing being larger than the width of each of the corresponding central ring teeth and orbital ring teeth wherein the interleaving of the orbital ring teeth and the central ring teeth defines an orbital/central ring tooth spacing between adjacent orbital ring teeth and central ring teeth.

18. The method of claim 16 wherein the installing step further includes arranging the plurality of central ring magnets in an alternating configuration of north-south poles.

19. The method of claim 16 wherein the installing step further includes arranging the plurality of orbital ring magnets in an alternating configuration of north-south poles.

20. The method of claim 16 wherein the installing step further includes bridging two adjacent magnets of the central ring, of the orbital or both of the central ring and the orbital ring to increase the magnetic force of the two adjacent magnets.

21. The method of claim 16 wherein the installing step further includes installing a magnetic drive indicator system that senses the interaction between the central ring and the orbital ring and that is adapted to differentiate when the non-contact magnetic drive rotation is enabled and when the mechanical drive rotation is enabled.

* * * * *